(12) United States Patent
Koga

(10) Patent No.: US 6,313,494 B1
(45) Date of Patent: Nov. 6, 2001

(54) SEMICONDUCTOR DEVICE HAVING A SELECTIVELY-GROWN CONTACT PAD

(75) Inventor: Hiroki Koga, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/203,385

(22) Filed: Dec. 2, 1998

(30) Foreign Application Priority Data

Dec. 3, 1997 (JP) .................................................. 9-332531

(51) Int. Cl.⁷ .................................................. H01L 27/108
(52) U.S. Cl. ........................ 257/296; 257/382; 257/627
(58) Field of Search .................................. 257/296, 306, 257/627, 628, 382

(56) References Cited

U.S. PATENT DOCUMENTS

| 5,231,043 | 7/1993 | Chan et al. . |
| 5,401,681 | 3/1995 | Dennison ................................. 437/60 |
| 5,753,555 | 5/1998 | Hada .................................... 438/300 |
| 5,895,948 | 4/1999 | Mori et al. ............................. 257/306 |
| 6,064,084 | 5/2000 | Tanahashi ............................. 257/296 |

FOREIGN PATENT DOCUMENTS

| 63-9964 | 1/1988 | (JP) . |
| 3-72675 * | 3/1991 | (JP) . |
| 3-272169 | 12/1991 | (JP) . |
| 6-5814 | 1/1994 | (JP) . |
| 7-74164 | 3/1995 | (JP) . |
| 10-154799 | 6/1998 | (JP) . |
| 11-97648 | 4/1999 | (JP) . |

OTHER PUBLICATIONS

Hada et al. "A Self–Aligned Contact Technology Using Anisotropical Selective Epitaxial Silicon For Giga–Bit DRAMs," International Electron Devices Meeting, Washington D.C. Dec. 10–13, 1995, pp. 665–668.

H. Hada, et al., "A Self–Aligned Contact Technology Using Anisotropical Selective Epitaxial Silicon for Giga–Bit DRAMs," pp. 665–668, *IEEE*.

* cited by examiner

*Primary Examiner*—Sara Crane
(74) *Attorney, Agent, or Firm*—Young & Thompson

(57) ABSTRACT

A semiconductor device, having a contact pad grown by an anisotropical silicon selective growth technique, includes a first word line crossing a diffusion layer formed on a substrate and surrounded by an element separating region at a right angle, a second word line parallel with the first word line formed over a rounded corner of the diffusion layer, and an area of the diffusion layer rectangularly partitioned by the first and second word lines. So that anisotropical silicon selective epitaxial growth from this area of the diffusion layer is achieved, avoiding isotropical growth deteriorated by the rounded corner.

19 Claims, 6 Drawing Sheets

US 6,313,494 B1

SEMICONDUCTOR DEVICE HAVING A SELECTIVELY-GROWN CONTACT PAD

BACKGROUND OF THE INVENTION

1. Field of the Invention

The present invention relates to a semiconductor device, and particularly to a semiconductor device having a self-aligned contact pad.

2. Description Related Art

Generally, if the degree of the integration of a semiconductor device is increased by reducing design dimensions in the semiconductor device, tolerance for the alignment of a contact hole with respect to lower semiconductor layers and lower wiring can become increasingly difficult.

Heretofore, a method of forming a contact pad using a selective anisotropic epitaxial silicon growth technique to solve such a problem was known. The above forming method using the selective anisotropic epitaxial silicon growth technique is described, for example, by Hada et al, "A Self-Aligned Contact Technology Using Anisotropic Selective Epitaxial Silicon For Giga-Bit DRAMs," IEDM Technical Digest, p.665, 1995.

FIG. 1 shows an arrangement wherein corners portions 2 of a diffusion layer 1 are exposed between word lines 3. The shape of the diffusion layer 1 is rectangular. (Diffusion layer 1 is an element forming region having portions into which dopants are diffused.) Crystal orientations of the long sides and the short sides of the diffusion layer 1 are arranged <110>. In this case, silicon is selectively grown on a diffusion layer 18. For example, the silicon is selectively subjected to anisotropic epitaxial growth using $Si_2H_6$ gas and $PH_3$ gas, setting the flow rate of $Si_2H_6$ gas to 1 cc per minute and setting the temperature of a silicon substrate to 700° C.

But if the corner portion 2 of the diffusion layer 1 is rounded, the crystal orientation of the corner portion 2 does not become <110>. As a result, ideal anisotropic growth may not occur and isotropic growth may occur.

FIG. 2 is a sectional view taken along the line II—II, FIG. 2 shows that if the silicon epitaxial growth is isotropic growth, there is a problem that epitaxial silicon 8 laterally grown is grown on element separating regions 5, and brought into contact with each other to cause a short circuit.

Moreover, as shown in FIG. 3, a crystal plane (facet) having crystal orientation other than [100] may be generated. If such facets are generated, as shown in FIG. 3, there is a problem that both upper parts of first facets 19 and second facets 20 are connected during growth to thereby block further vertical epitaxial growth.

SUMMARY OF THE INVENTION

An object of the present invention is to provide a semiconductor device in which isotropic growth is avoided when silicon is selectively subjected to anisotropic epitaxial growth on source regions and drain regions of a memory cell transistor.

Another object of the present invention is to provide a semiconductor device in which no crystal plane having crystal orientation other than [100] is produced when silicon is selectively subjected to anisotropic epitaxial growth on the source regions and the drain regions of a memory cell transistor.

Another object of the present invention is to provide a semiconductor device covering rounded corners of the diffusion layer with a word line so as to grow source or drain contact pads preferably from the diffusion layer.

DESCRIPTION OF THE PREFERRED EMBODIMENTS

The present invention will be described below with reference to the drawings.

Figure 1:
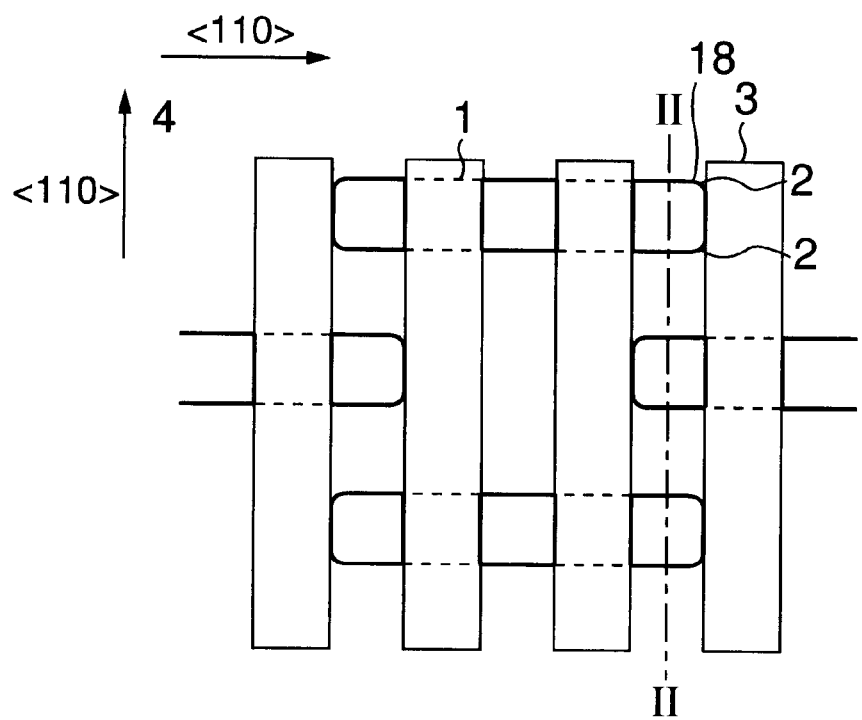
FIG. 1 is a plan view showing a memory cell array of a conventional dynamic random access memory.
Figure 2:
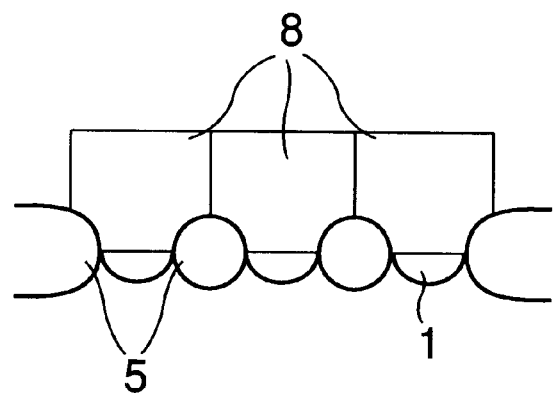
FIG. 2 is a sectional view taken along the line II—II in FIG. 1.
Figure 3:
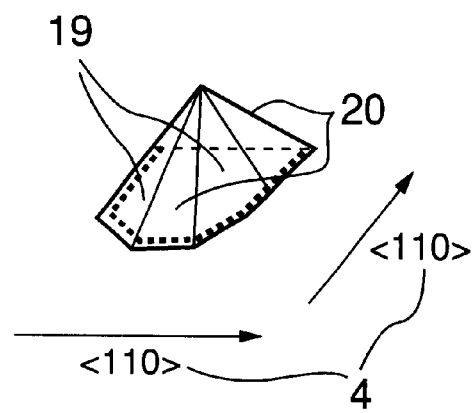
FIG. 3 shows the generation of crystal planes (facets) having crystal orientation other than [100].
Figure 4:
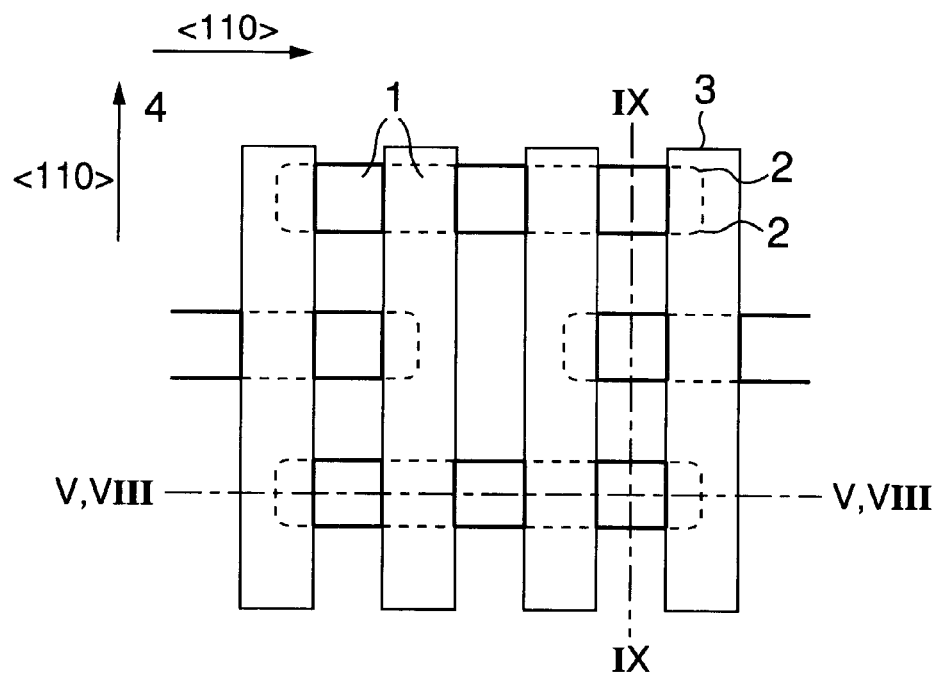
FIG. 4 is a plan view showing a memory cell array of a dynamic random access memory which is an example of a semiconductor device according to the present invention.
Figure 5:
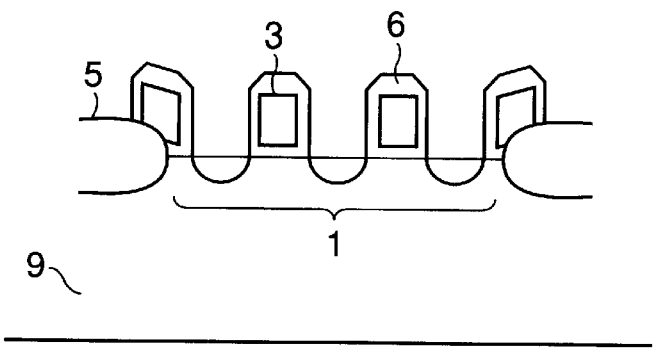
FIG. 5 is a sectional view taken along the line V—V in FIG. 4.

FIG. 4 is a plan view showing a memory cell array according to the present invention. The embodiment shown in the figure is a dynamic random access memory (DRAM) used as a semiconductor device. FIG. 5 is a sectional view taken along the line V—V in FIG. 4.

Referring also to FIG. 5, element separating regions 5 are formed on a silicon substrate 9. Diffusion layers 1, on which transistors are formed, are separated by the element separating regions 5. Word lines 3 which also function as gate electrodes of the transistor are provided on the diffusion layers 1 and the element separating regions 5. Further, an insulating film 6 is formed on the upper and side surfaces of the word lines 3. Further, all the corner portions 2 of the diffusion layer pattern are arranged under the word lines 3.

In such an arrangement, as a exposed portion of the diffusion layer 1 is shaped by a pair of boundary lines between the diffusion layer and the element separation region extended in an orientation <110> of the diffusion layer, with each side surface of the word lines extended in the orientation <110>. The shape of the exposed portion of the diffusion layer is a rectangle having four sides running in the direction <110>.

Therefore, silicon is selectively subjected to the anisotropic epitaxial growth only on the exposed region of the diffusion layer between the word lines, thereby suppressing isotropic growth and crystal planes having crystal orientation other than [100].

Figure 6:
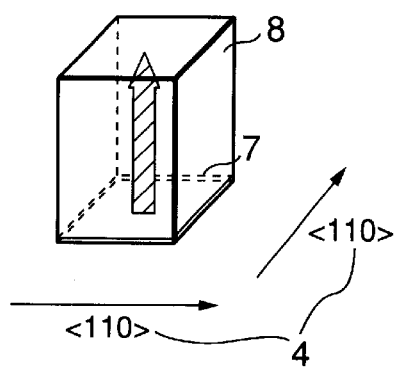
FIG. 6 is an explanatory drawing for explaining anisotropic growth.
Figure 7:
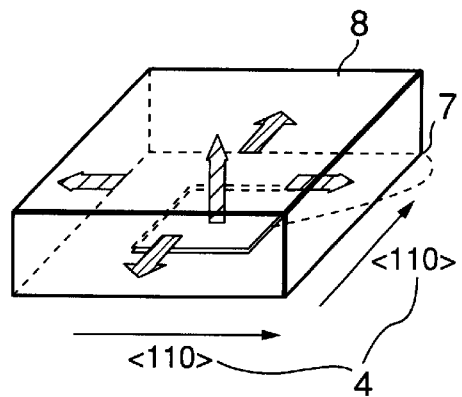
FIG. 7 is an explanatory drawing for explaining isotropic growth.

Description will be made more specifically by referring to FIGS. 6 and 7. FIGS. 6 and 7 conceptually show the selective epitaxial silicon growth. FIG. 6 shows the anisotropic growth and FIG. 7 shows the isotropic growth thereof.

As shown in FIG. 6, in the case where ideal selective anisotropic epitaxial silicon growth was carried out, the silicon is grown only in a vertical direction on the rectangular diffusion layer 7. Silicon is not grown laterally on the four sides of which are extended in a direction of the crystal orientation <110>.

On the other hand, as shown in FIG. 7, in the case where selective isotropic epitaxial silicon growth is carried out, the quantity of silicon that is grown vertically on the rectangular diffused layer 7 is equal to and the quantity of silicon that is grown laterally on the surrounding element separating regions.

If a silicon pad is formed by selectively growing the silicon epitaxially on the diffused layer in a memory cell, anisotropy is required to be kept high to prevent adjacent silicon pads from coming into contact to cause a short circuit therebetween.

Figure 8:
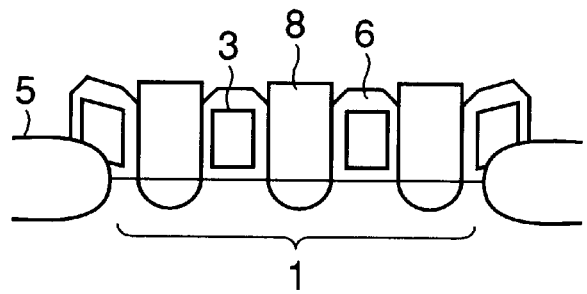
FIG. 8 is a sectional view taken along the line VIII—VIII in FIG. 4 when silicon is selectively subjected to anisotropic epitaxial growth in a memory cell.
Figure 9:
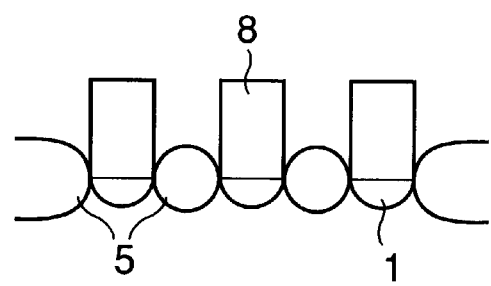
FIG. 9 is a sectional view taken along the line IX—IX in FIG. 4 when the silicon is selectively subjected to the anisotropic epitaxial growth in the memory cell.

FIGS. 8 and 9 are sectional views when the silicon is selectively subjected to the anisotropic epitaxial growth in a memory cell. FIG. 8 is a sectional view taken along the line VIII—VIII in FIG. 4, and FIG. 9 is a sectional view taken along the line IX—IX in FIG. 4. Epitaxial silicon 8 are used as source or drain contact pads of the diffusion layer 1. As described above, in the memory cell array shown in FIG. 4, the corner portions of diffused layers are arranged below the word lines. As a result, when the silicon is subjected to selective anisotropic growth in the memory cell, the suppressing effect of the epitaxial growth in the direction along the element separating regions 5, or, in a lateral direction, is remarkably improved.

Figure 10:
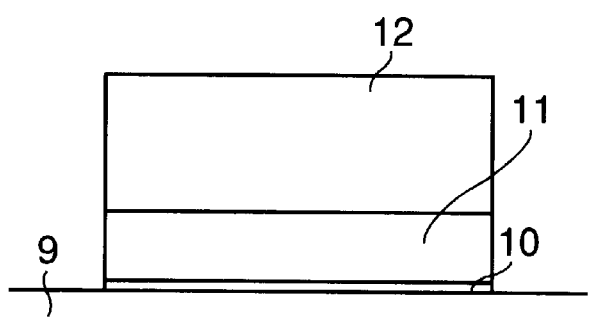
FIG. 10 is an explanatory drawing for explaining a process for manufacturing an example of the semiconductor device according to the present invention.
Figure 11:
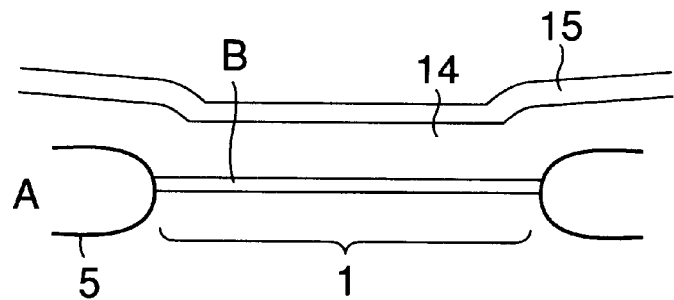
FIG. 11 is an explanatory drawing for explaining a process for manufacturing the example of the semiconductor device according to the present invention.
Figure 12:
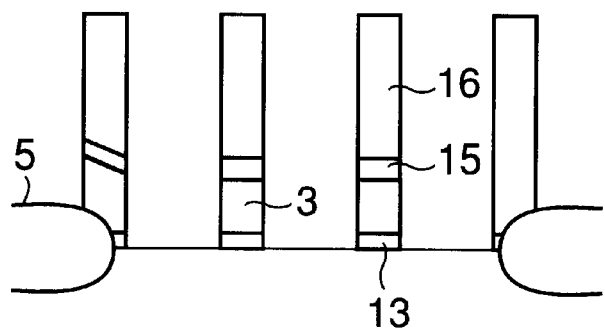
FIG. 12 is an explanatory drawing for explaining a process for manufacturing the example of the semiconductor device according to the present invention.

Referring to FIGS. 10 to 12, the manufacture of a memory cell according to the present invention will be described below.

First, a first silicon oxide film 10 in a range between 5 and 30 nm, preferably approximately 20 nm thick, is formed on the surface of a silicon substrate 9 using a normal wet oxidation method (FIG. 10).

Next, a silicon nitride film 11 in a range between 150 and 350 nm, preferably approximately 250 nm, thick is formed on the first silicon oxide film 10 by chemical vapor deposition (hereinafter referred to as CVD) (FIG. 10).

Next, a photoresist 12 is deposited as a residual in a position in which a diffusion layer is to be formed on the silicon nitride film 11 using well-known photo lithography. Afterward, the silicon nitride film 11 and the first silicon oxide film 10 are sequentially etched using the resist 12 as a mask by anisotropic dry etching (FIG. 10).

Next, as shown in FIG. 11, after the resist 12 is removed by oxygen plasma ashing or a method using an organic solvent, element separating regions 5 in a range between 200 and 400 nm preferably approximately 300 nm thick, are formed by oxidizing the exposed silicon substrate by a normal wet oxidation method. At this time, since the silicon nitride film 11 exists in a location in which a diffused layer is to be formed as a mask resistant to oxidation, the surface of the silicon substrate in this part is not oxidized.

Further, the silicon nitride film 11 is removed using a solution of phosphoric acid heated up to a temperature in a range between 100 and 150° C. for example. The first silicon oxide film 10 is removed by the solution of hydrofluoric acid. A gate oxide film 13 is formed by oxidizing the surface in a range between 10 and 15 nm of the diffused layer 1 by wet oxidation method (FIG. 11) .

Next, polycrystalline silicon 14 in which phosphorus is doped in large quantity is formed in a range between 100 and 250 nm, preferably approximately 200 nm, thick and successively, a second silicon oxide film 15 in a range between 100 and 200 nm thick is formed by CVD (FIG. 11).

Next, photoresists 16 are deposited as residuals in the positions in which word lines are to be formed using photo lithography (FIG. 12). Afterward, the second silicon oxide film 15 and the polycrystalline silicon 14 are sequentially etched by anisotropic dry etching using the resists 16 as the mask. The polycrystalline silicon 14, the unnecessary parts of which are removed by etching, function as the word lines 3 (FIG. 12).

Figure 13:
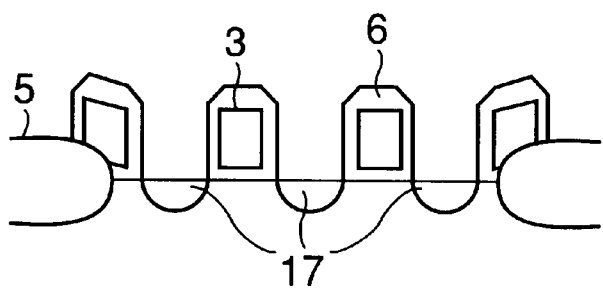
FIG. 13 is an explanatory drawing for explaining a process for manufacturing the example of the semiconductor device according to the present invention.

Further, after the resists 16 are removed by oxygen plasma ashing or using an organic solvent, a silicon oxide film is formed overall by CVD (FIG. 13). The thickness of the silicon oxide film is required to be set to a thickness so that the space between the word lines is not completely filled. Afterward, the overall film is etched back by anisotropic dry etching and a spacer composed of a silicon oxide film is formed on the side of each word line. The side and the upper surfaces of the word lines 3 are covered with the insulating film 6 because of the spacer and the second silicon oxide film on the word line (FIG. 13).

Again with reference to FIG. 8, finally, epitaxial silicon 8 are grown from source or drain regions of the diffusion layer 1 by anisotropical selective growth technique, so that source or drain contact pads.

As described above, the semiconductor device is formed, however, as in the embodiment shown in the drawings, with a layout that ensures all the corner portions of the diffusion layers are arranged below the word lines. With the diffusion layers 1 and the word lines 3 thus formed, the rounded corner portions are not exposed between the word lines. As a result, if the silicon is selectively subjected to the anisotropic epitaxial growth only on the diffused layer exposed between the word lines, the defect that the anisotropy is deteriorated and the isotropic growth occurs or a crystal plane having other than the crystal orientation [100] is produced can be avoided.

In the above example, the word line 3 is made of polycrystalline silicon, however, to reduce the resistance of the word line, a structure in which polycrystalline silicon and silicide material, for example, tungsten silicide, titanium silicide or cobalt silicide and the like laminated, may be employed. Further, to reduce the resistance, a structure may be obtained in which polycrystalline silicon and high melting point metal such as tungsten may also be laminated.

Further, in the above example, the element separating region 5 is formed by the local oxidation of silicon (hereinafter referred to as LOCOS); however, the element separating region may also be formed by shallow trench isolation (hereinafter referred to as STI).

Figure 14:
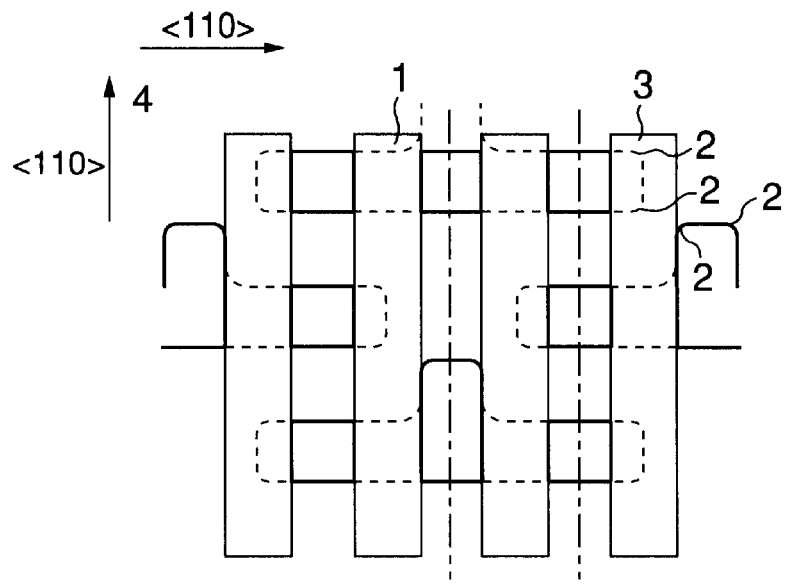
FIG. 14 is a plan view showing a memory cell array in another example of the semiconductor device according to the present invention.
Figure 15:
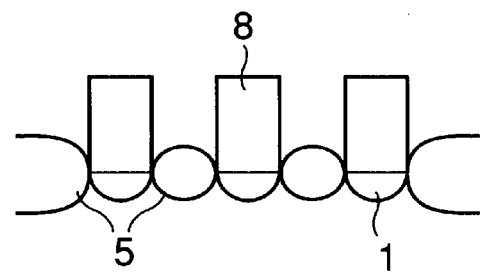
FIG. 15 is a sectional view taken along the line XV—XV in FIG. 14.

Referring to FIGS. 14 and 15, another embodiment of the semiconductor device according to the present invention will be described below.

Previously, a memory cell array in which the diffused layer has a rectangular shape was described. The present invention may, however, also be applied to a memory cell array in which the shape of the diffused layer is other than rectagular, e.g., a convex shape.

Figure 16:
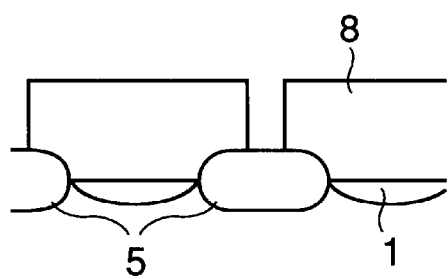
FIG. 16 is a sectional view taken along the line XVI—XVI in FIG. 14.

As shown in FIG. 14, the rounded corner portions 2 of the diffused layer are exposed between the word lines 3 in the center of the convex diffused layer 1. Generally, if the rounded portions are included as described above, the anisotropy for selectively growing silicon is deteriorated and lateral growth results so that the grown epitaxial silicon further grows on the element separating regions 5 as shown in FIG. 16 (a sectional view taken along the line XVI—XVI in FIG. 14).

However, in the embodiment shown in the drawings, the distance between the central part of the convex diffusion layer 1 and the central part of the adjacent diffusion layer is longer than the distance between the end of the diffusion layer and the end of the adjacent diffusion layer. Therefore, even if the lateral growth occurs, the clearance is large enough to avoid contact of the epitaxial silicon 8 with the adjacent one which would otherwise cause short circuit. As shown in FIG. 15, which is a sectional view taken along the line XV—XV in FIG. 14, the distance between the end of the diffusion layer and the end of the adjacent diffusion layer is small and there is only a small clearance. However, since the rounded corner portions 2 at the end of the diffusion layers are not exposed, the epitaxial silicons 8 exhibit little lateral growth.

As described above, since the diffusion layer is convex in the layout of a memory cell in this embodiment, an area in which a contact hole connected to the center of the diffusion layer can be made is larger, as compared with the case that the shape of the diffusion layer is simply rectangular. Therefore, the clearance in aligning a contact hole connected to the center of the diffusion layer is increased.

As described above, according to the present invention, since the diffusion layer to be exposed after the word lines are formed is in the shape of a rectangle defined by a pair of sides in orientation <110> among the sides defining the diffusion layer and the word lines and the corner portions of the diffusion layers are arranged below the word lines, the effect can be obtained in which isotropic growth caused by the deterioration of the anisotropy is avoided when the silicon is selectively subjected to the anisotropic epitaxial growth only on the diffusion layer exposed between the word lines, and further, no crystal plane having the crystal orientation other than [100] is produced.

What claimed is:

1. A semiconductor device comprising:
    a substrate;
    an element separating region formed on said substrate;
    an element forming region formed on said substrate and surrounded by said element separation region;
    a first gate electrode crossing said element forming region;
    a second gate electrode formed over an end of said element forming region so as to cover corners of said end; and
    a source or drain contact pad which is selectively grown from an exposed part of said element forming region, said exposed part being located between said first gate electrode and said second gate electrode.

2. The device of claim 1, wherein said semiconductor device is a semiconductor memory device, and said gate electrode is a word line.

3. The device of claim 1, wherein a top and sides of said gate electrode are covered with a insulation film.

4. The device of claim 1, wherein said drain or source contact pad is an anisotropical selective epitaxial silicon grown layer.

5. The device of claim 1, wherein said first gate electrode and said second gate electrode each meet right angle with a boundary line between said element separating region and said element forming region.

6. The device of claim 5, wherein said boundary line extends in crystal orientation direction <110>.

7. The device as claimed in claim 5, wherein said first gate electrode and second gate electrode extend in crystal orientation direction <110>.

8. The device of claim 1, wherein said corner of said element forming region are rounded corners.

9. The device of claim 1, wherein said exposed part of said element forming region is rectangular.

10. A semiconductor device comprising:
    a plurality of element forming regions each formed on a substrate and surrounded by an element separating region;
    a plurality of gate electrodes each crossing at least one of said plurality of element forming regions and overlapping a corner of another of said plurality of element forming regions; and
    a plurality of contact pads selectively grown from exposed parts of said plurality of element forming regions, each of said exposed parts being located between two of said plurality of gate electrodes.

11. The device of claim 10, wherein said semiconductor device is a semiconductor memory device, and each of said plurality of gate electrode is a word line.

12. The device as claimed in claim 10, further comprising an insulation film intermediate one of said contact pads and an adjacent gate electrode.

13. The device of claim 10, wherein each of said plurality of contact pads is an anisotropical selective epitaxial silicon grown layer.

14. The device of claim 10, wherein an edge of the plurality of gate lines each meets at a right angle with a boundary line between said element separating region and another element forming region.

15. The device of claim 14, wherein said boundary line extends in crystal orientation directon <110>.

16. The device of claim 14, wherein said edge of said gate lines each extends in crystal orientation directon <110>.

17. The device of claim 10, wherein said corner of said element forming region is a rounded corner.

18. The device of claim 10, wherein one of said exposed regions is generally rectangular with rounded corners on a first end and square corners on a second end.

19. The device of claim 10, wherein said exposed regions are rectagular with square corners.

* * * * *